US006623298B2

(12) United States Patent
Lin et al.

(10) Patent No.: US 6,623,298 B2
(45) Date of Patent: Sep. 23, 2003

(54) CPU SOCKET CONNECTOR

(75) Inventors: Nick Lin, Tu-Chen (TW); Hsiu-Yuan Hsu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/126,842

(22) Filed: Apr. 19, 2002

(65) Prior Publication Data

US 2003/0119357 A1 Jun. 26, 2003

(30) Foreign Application Priority Data

Dec. 26, 2001 (TW) ...................................... 90222999 U

(51) Int. Cl.[7] ................................................ H01R 13/73
(52) U.S. Cl. ........................ 439/570; 439/566; 439/342
(58) Field of Search ............................ 439/342, 64, 74, 439/569–572, 566, 73

(56) References Cited

U.S. PATENT DOCUMENTS

| | | | | |
|---|---|---|---|---|
| 5,199,884 A | * | 4/1993 | Kaufman et al. | 439/74 |
| 6,152,766 A | * | 11/2000 | Wu et al. | 439/570 |
| 6,155,848 A | * | 12/2000 | Lin | 439/135 |
| 6,231,367 B1 | * | 5/2001 | Hsiao et al. | 439/342 |
| 6,319,059 B1 | * | 11/2001 | Wu | 439/607 |

* cited by examiner

*Primary Examiner*—Hien Vu
(74) *Attorney, Agent, or Firm*—Wei Te Chung

(57) ABSTRACT

An electrical socket connector comprises a base (11), a cover (12) movably mounted on the base, and a fastening means (14). The base has a contact receiving portion (111) and a first protruding section (110) at one end thereof. A plurality of conductive contacts are received into the contact receiving portion of the base and each contact has a solder ball (112) attached thereon. The fastening means is assembled on the first protruding section of the base and at least has a soldering portion (141). The soldering portion and the solder balls are soldered on a PCB.

1 Claim, 10 Drawing Sheets

CPU SOCKET CONNECTOR

BACKGROUND OF THE INVENTION

1. Field of the Invention

The present invention relates to a central processing unit (CPU) socket connector, and particularly to a CPU socket connector that can be securely soldered on a printed circuit board (PCB).

2. Description of Related Art

Referring to FIGS. 8 and 8A, a conventional CPU socket connector 8 (shown upside down against a printed circuit board (PCB) 7) comprises a base 82, a cover 83 movably mounted on the base 82, and an actuator 84 for driving the cover 83 to move on the base 82. The base 82 generally has a protruding section 821 at one end thereof. A plurality of conductive contacts (not shown) are received in the base 82 and each contact has a solder ball 81 attached thereon. The socket connector 8 is soldered on an upper surface of the PCB 7 by being subjected to a reflow process. The soldering balls 81 are soldered on solder pads (not shown) attached on the upper surface of the PCB 7 so that the socket connector 8 is electrically connected with the PCB 7.

Sometimes, it is desirable to solder a plurality of electrical elements on a bottom surface of the PCB 7 after the socket connector 8 is soldered on the upper surface, so the PCB 7 must be turned over and subjected to a reflow process with the socket connector 8 already in place. The solder balls 81 will melt again during the second reflow process and the socket connector 8 will tend to incline downwardly because the center of gravity of the socket connector 8 is near the protruding section 821. The soldering balls 81 adjacent to the protruding section 821 may become disconnected from the solder pads on the PCB 7 (see FIG. 8A) and this affects the electrical connection between the contacts of the socket connector 8 and the PCB 7.

SUMMARY OF THE INVENTION

An object of the present invention is to provide a CPU socket connector which is securely retained on a PCB during an invented solder reflow process by providing a fastening means soldered on the PCB.

In order to achieve the object set forth, an electrical socket connector in accordance with the present invention comprises a base, a cover movably mounted on the base and a fastening means. The base has contact receiving portion over much of its bottom surface, and a first protruding section at one end thereof. A plurality of conductive contacts are received into corresponding passageways of the base and each has a solder ball attached thereon. The fastening means is assembled on the first protruding section of the base and at least has a soldering portion. The soldering portion and the solder balls are soldered on the PCB together.

Other objects, advantages and novel features of the invention will become more apparent from the following detailed description when taken in conjunction with the accompanying drawings.

DETAILED DESCRIPTION OF THE INVENTION

Figure 1:
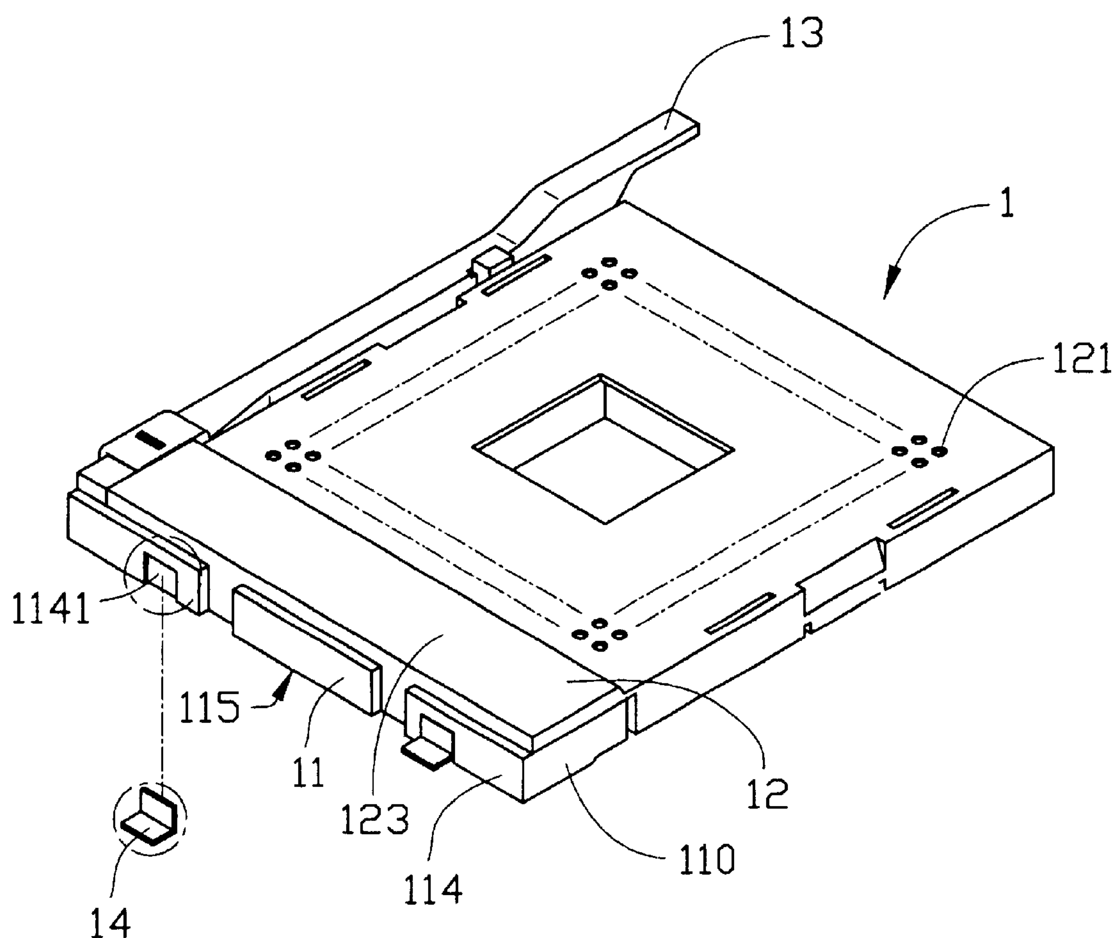
FIG. 1 is a perspective view of a CPU socket connector in accordance with the present invention.
Figure 1A:
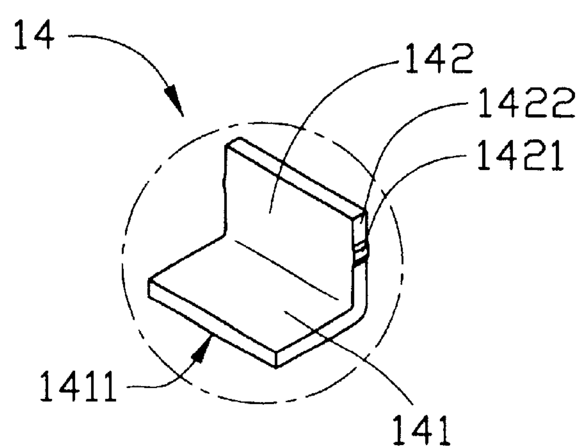
FIG. 1A is an enlarged view of a fastening means of FIG. 1.
Figure 1B:
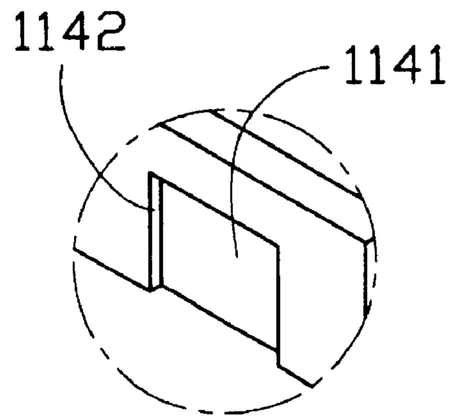
FIG. 1B is an enlarged view of a recess of FIG. 1.
Figure 2:
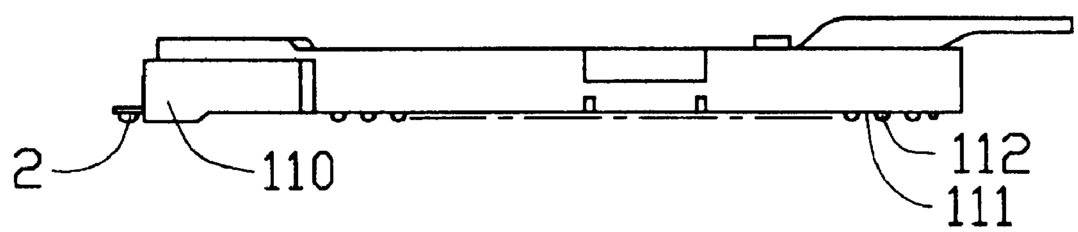
FIG. 2 is a side view of the CPU socket connector shown in FIG. 1.

Referring to FIGS. 1, 1A, 1B and 2, a central processing unit (CPU) socket connector 1 in accordance with a first embodiment of the present invention comprises a base 11, a cover 12 movably mounted onto the base 11, an actuator 13 and a fastening means 14.

The base 11 has a contact receiving portion 111, and a first protruding section 110 extending from one end of the contact receiving portion 111. The contact receiving portion 111 has a plurality of contacts (not shown) received therein and each contact has a solder ball 112 attached thereon. Each solder ball 112 extends out of the base 11 from a bottom surface 115. The socket connector 1 can be electrically connected with a printed circuit board (PCB) (not shown) with the solder balls 112 soldered on the PCB. The first protruding section 110 defines a pair of recesses 1141 in a sidewall 114 of the first protruding section 110, with a pair of securing walls 1142 at a pair of sides of each recess 1141. The cover 12 has a second protruding section 123 formed at one end thereof corresponding to the first protruding section 110 of the base 11 and a plurality of terminal receiving holes 121 corresponding to the contact receiving portion 111. The actuator 13 with a cam (not shown) engaged in the first protrusion section 110 and the second protrusion section 123, can drive the cover 12 to move on the base 11.

The fastening means 14 is stamped from a metal sheet and comprises a horizontal portion 141 and a vertical portion 142 vertically extending from one end of the horizontal portion 141. The vertical portion 142 has a pair of barbs 1421 formed on opposite sides 1422 thereof. The vertical portion 142 is received in the recess 1141 and the horizontal portion 141 extends opposite to the base 11. The barbs 1421 interferentially engage with the securing walls 1142 thereby ensuring the vertical portion 142 of the fastening means 14 are fixed in the recesses 1141. The bottom surface 1411 of the horizontal portion 141 has solder 2 attached thereon.

The socket connector 1 is soldered on the PCB with the solder 2 on the horizontal portion 141 of the fastening means 14 and the solder balls 112 being soldered on the PCB together. Thus, the mating force between the socket connector 1 and the PCB is increased. When the PCB is turned over and subjected to a back side reflow process together with the socket connector 1, the solder balls 112 and the solder 2 are heated. The socket connector 1 does not incline downwardly because of the connecting force between the solder 2 and the PCB.

Figure 3:
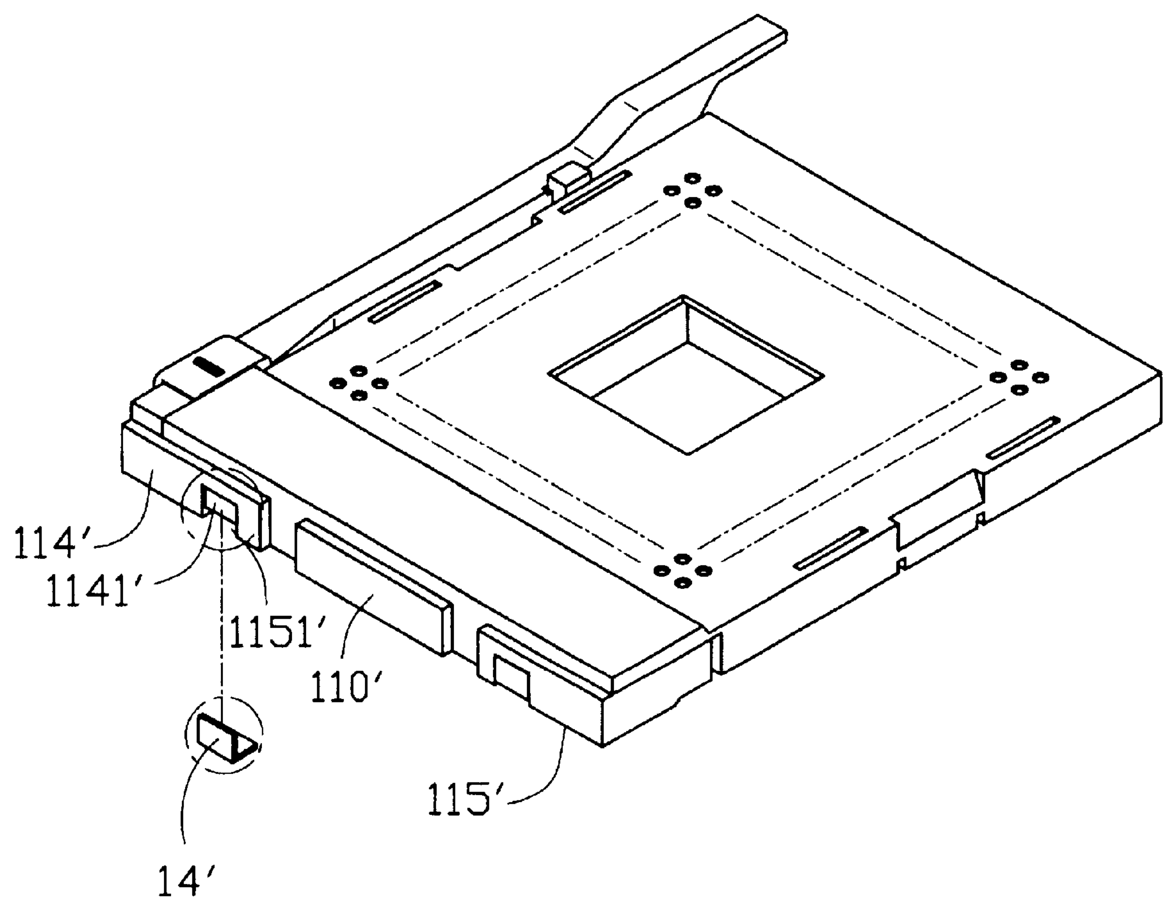
FIG. 3 is a perspective view of a CPU socket connector in accordance with a second embodiment of the present invention.
Figure 3A:
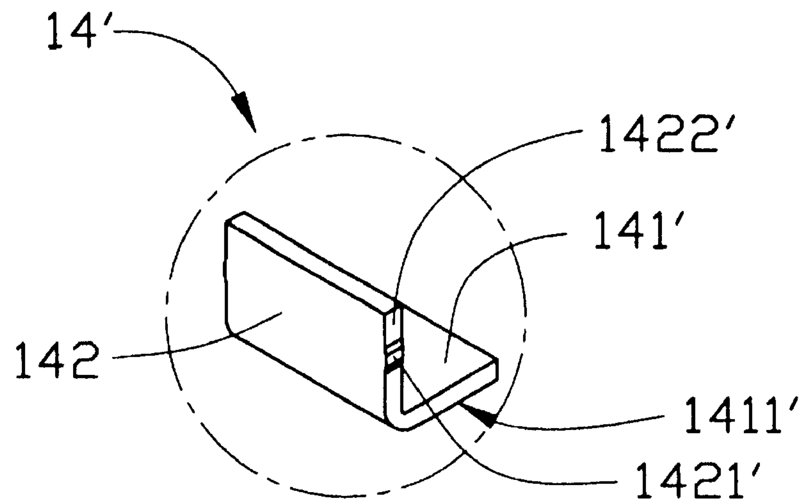
FIG. 3A is an enlarged view of a fastening means of FIG. 3.
Figure 3B:
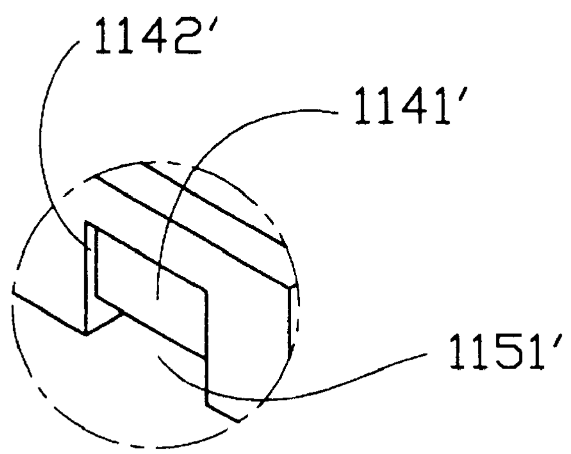
FIG. 3B is an enlarged view of vertical and horizontal recesses of FIG. 3.
Figure 4:
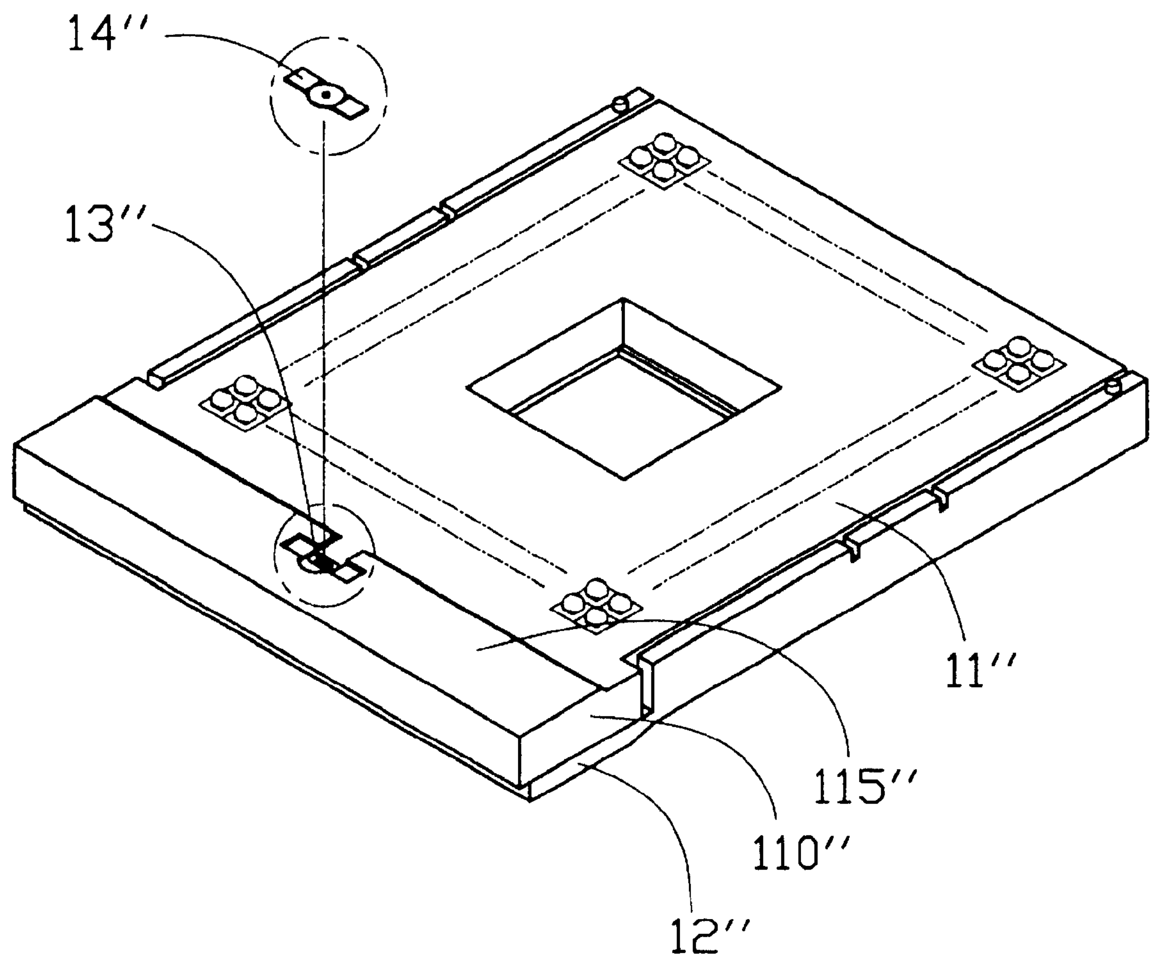
FIG. 4 is a perspective bottom-aspect view of a CPU socket connector in accordance with a third embodiment of the present invention.
Figure 4A:
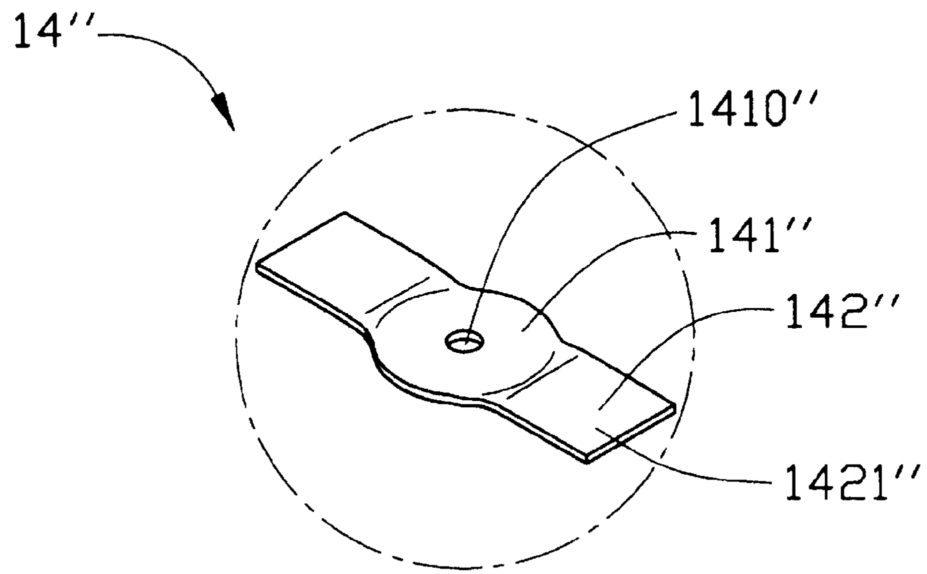
FIG. 4A is an enlarged view of a fastening means of FIG. 4.
Figure 4B:
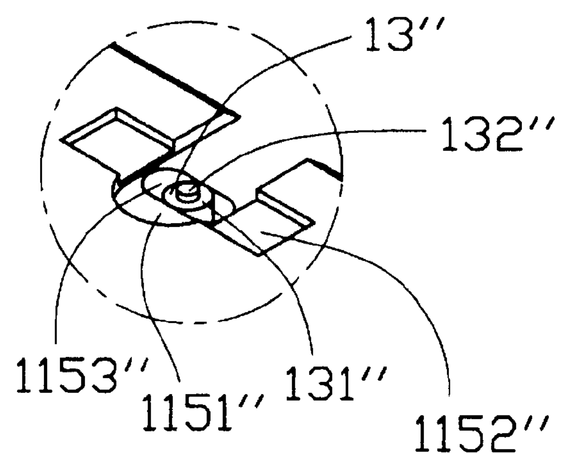
FIG. 4B is an enlarged view of an actuator received in the CPU socket connector of FIG. 4.
Figure 5:
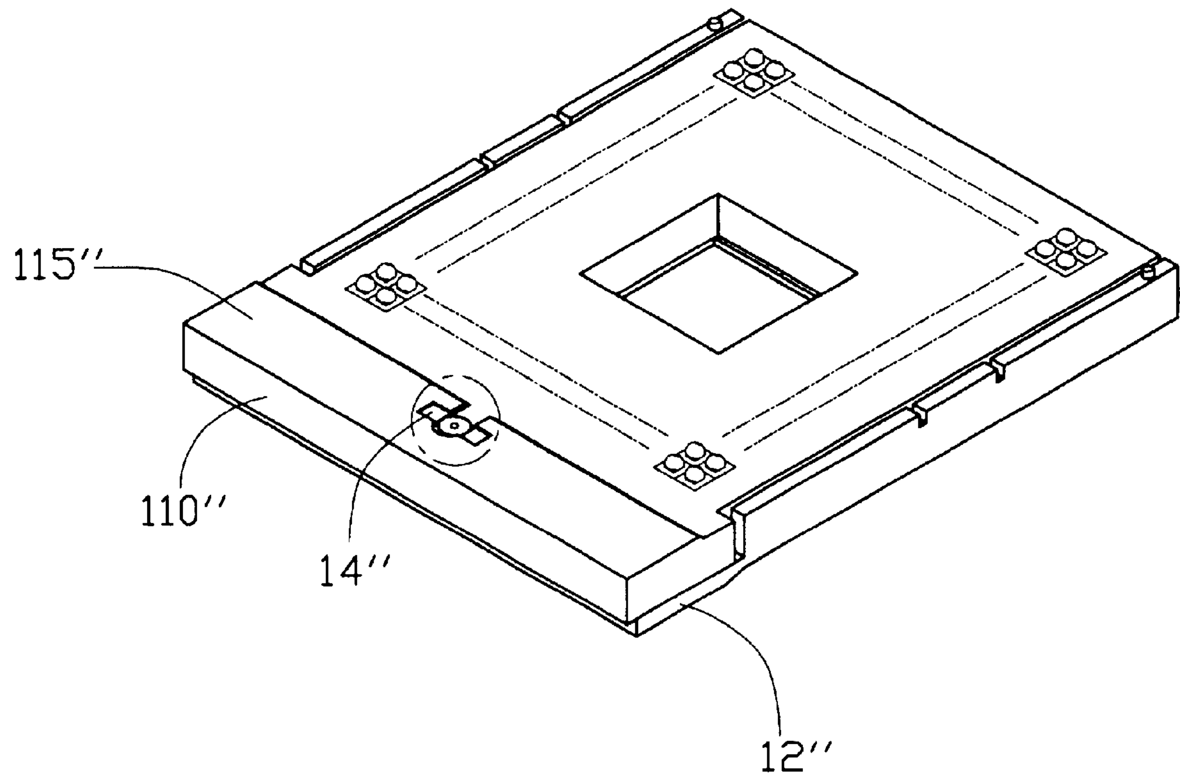
FIG. 5 is an assembled view of FIG. 4.
Figure 5A:
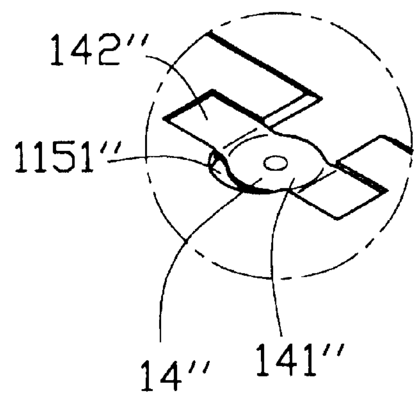
FIG. 5A is an enlarged view of the assembled fastening means of FIG. 5.

FIGS. 3, 3A and 3B show a CPU socket connector in accordance with a second embodiment of the present invention. A first protruding section 110' defines a pair of horizontal recesses 1151' in a bottom surface 115', the horizontal recesses 1151' being in communication with a pair of vertical recesses 1141' defined in a side wall 114' of the first protruding section 110'. A fastening means 14' comprises a horizontal portion 141' and a vertical portion 142' perpendicular to the horizontal portion 141'. The vertical portion 142' has a pair of barbs 1421' formed on opposite sides 1422' thereof. After the fastening means 14' is assembled to the first protruding section 110', the vertical portion 142' is received in the vertical recess 1141' with the barbs 1421' interferentially engaging with securing walls 1142' of the vertical recess 1141' and the horizontal portion 141' being received in the horizontal recess 1151'. The horizontal portion 141' are soldered on a PCB 6 during a reflow process. The fastening means 14' have the same function as the fastening means 14 of the CPU socket connector in accordance with the first embodiment and an area occupied by the CPU socket connector is less for the second embodiment than for the first embodiment.

FIGS. 4, 4A, 4B, 5 and 5A show a CPU socket connector in accordance with a third embodiment of the present invention. A first protruding section 110" of a base 11" defines an elliptical hole 1153" in a center of a bottom surface 115" thereof. A cover 12" defines a circular hole (not shown) corresponding to the elliptical hole 1153". An actuator 13" is received in the elliptical hole 1153" and in the circular hole. The actuator 13" comprises a cam 131" and a riveting portion 132". A fastening means 14" is stamped from a metal sheet and comprises a base portion 141", a through hole 1410" defined through the base portion 141" and a pair of soldering portions 142" extending downwardly and outwardly from opposite sides of the base portion 141". The first protruding section 110" of the base 11" defines a circular recess 1151" encircling the elliptical hole 1153" and a pair of rectangular recesses 1152" on opposite sides of the circular recess 1151". In assembly, the riveting portion 132" is received in the through hole 1410", the base portion 141" is received in the circular recess 1151" and the pair of soldering portions 142" is received in the pair of rectangular recesses 1152". Each soldering portion 142" has a solder surface 1421" which has a same function as the horizontal portion 141 of the first embodiment.

Figure 6:
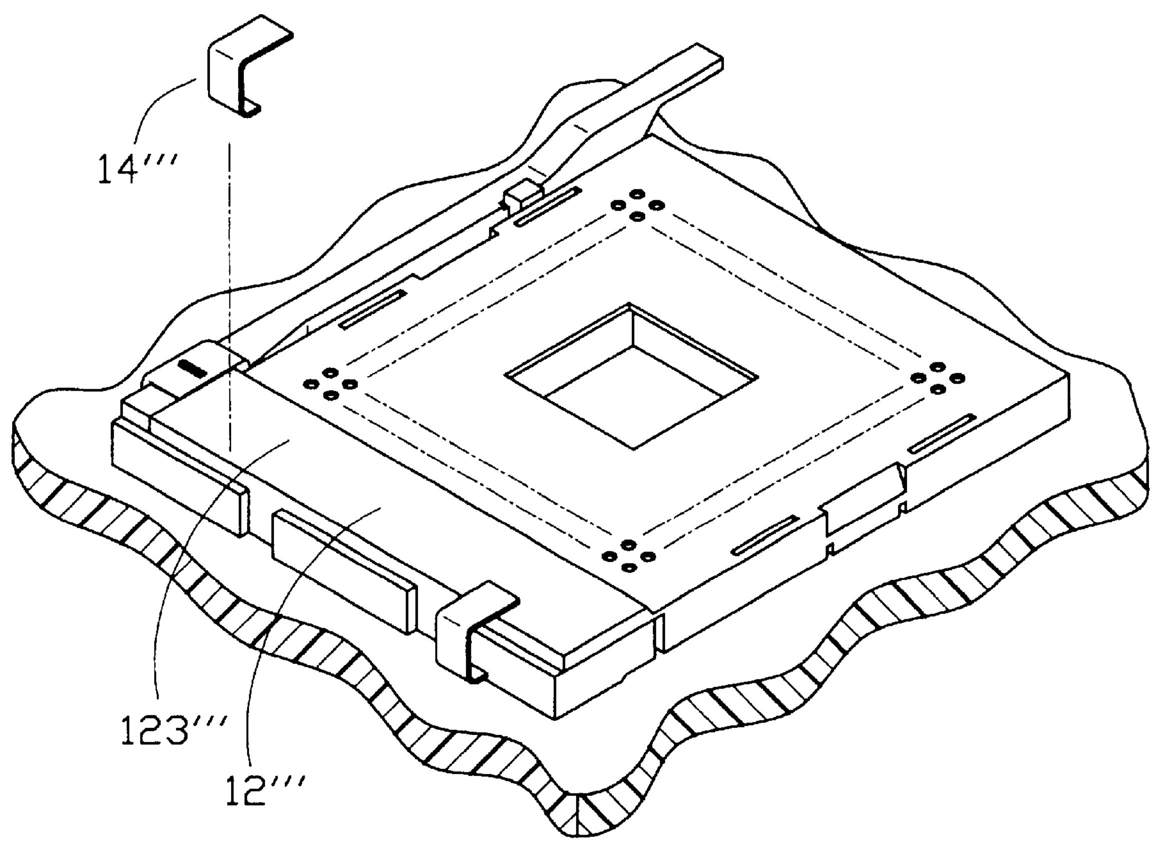
FIG. 6 is a perspective view of a CPU socket connector in accordance with a fourth embodiment of the present invention.
Figure 6A:
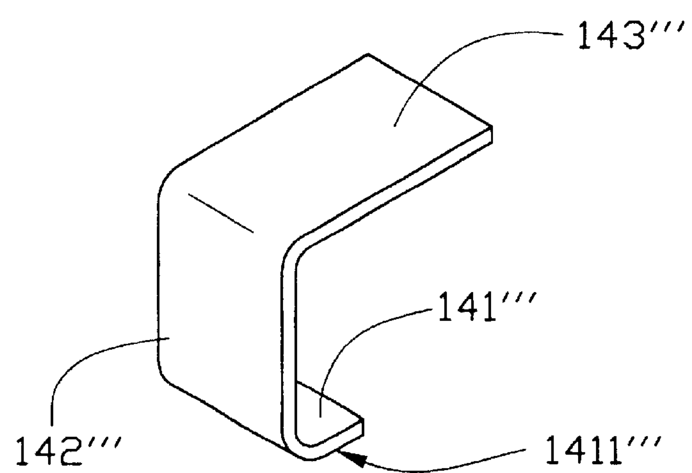
FIG. 6A is an enlarged view of a fastening means of FIG. 6.
Figure 7:
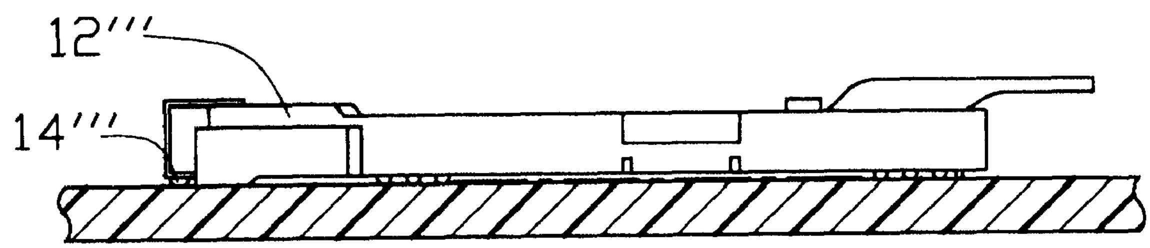
FIG. 7 is a side view of the CPU socket connector shown in FIG. 6.
Figure 8:
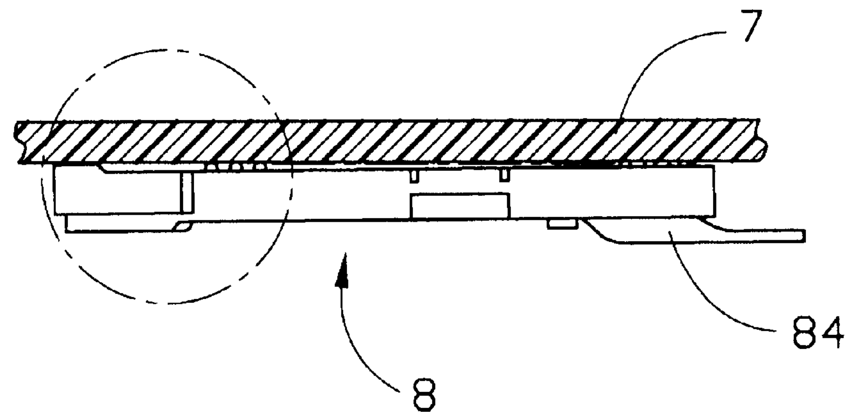
FIG. 8 is a side view of a conventional CPU socket connector.
Figure 8A:
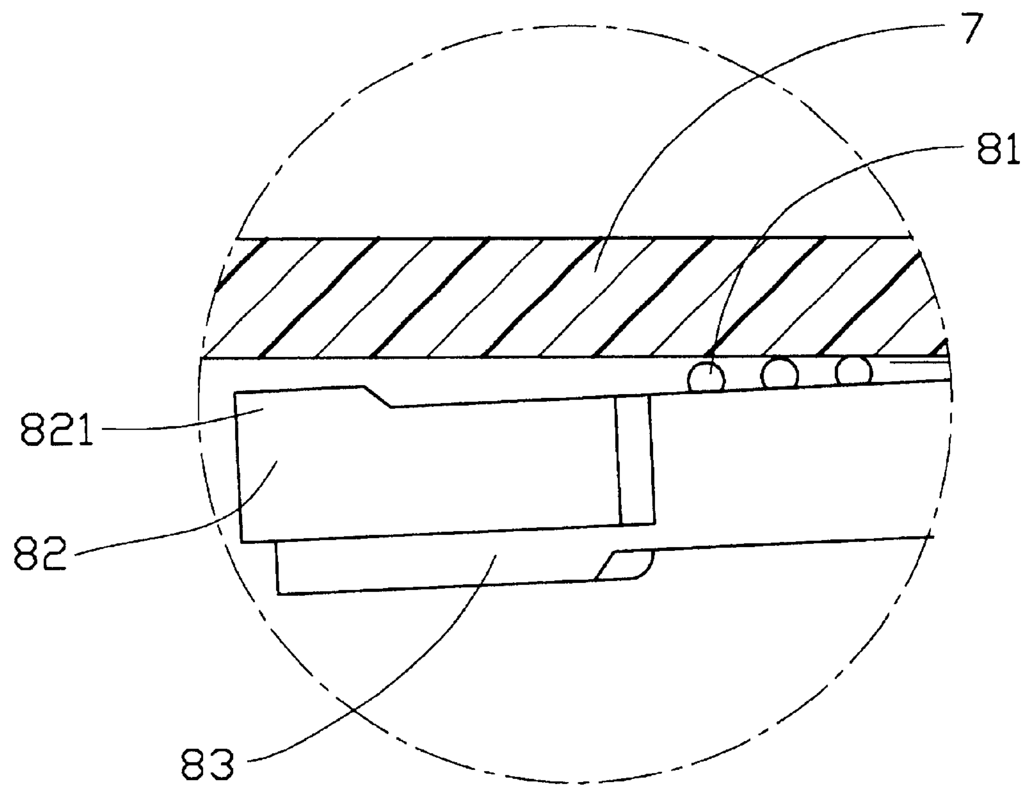
FIG. 8A is a partially enlarged view of FIG. 8.

FIGS. 6, 6A and 7 show a CPU socket connector in accordance with a fourth embodiment of the present invention. A fastening means 14'" comprises a vertical portion 142'" and a first and second horizontal portions 141'", 143'" extending from opposite ends of the vertical portion 142'". The first horizontal portion 141'" has a solder surface 1411'" and is soldered on a PCB. The second horizontal portion 143'" extends toward the CPU socket connector and abuts an upper surface of the second protruding section 123'" of the cover 12'" for securing a the CPU socket connector on the PCB.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical socket connector for being soldered on a printed circuit board (PCB) comprising:

a base having a plurality of passageways defined therethrough and a first protruding section formed at one end thereof;

a plurality of conductive contacts received in the passageways of the base and each contact having a solder ball attached thereon;

a cover being movably mounted on the base; and at least a fastening means assembled on the first protruding section of the base and having at least a soldering portion, the soldering portion and the solder balls being soldered on the PCB; wherein the cover has a second protruding section formed at one end thereof and corresponding to the first protruding section of the base, and an actuating lever is mounted to the first and second protruding sections; wherein the fastening means is stamped from a metal sheet and comprises a horizontal portion and a vertical portion vertically extending from one end of the horizontal portion, and the horizontal portion is the soldering portion; wherein the vertical portion of the fastening means has a pair of barbs formed on opposite sides thereof; wherein the first protruding section of the base defines at least a recess in a sidewall thereof with a pair of securing walls at a pair of sides of the recess, the vertical portion of the fastening means being received in the recess and the barbs of the vertical portion interferentially engaging with the securing walls of the recess; wherein the horizontal portion of the fastening means extends opposite to the base; wherein the first protruding section of the base has a horizontal recess in a bottom surface thereof and in communication with the recess in the sidewall of the first protruding section, and the horizontal portion of the fastening means is received in the horizontal recess of the base.

* * * * *